(12) United States Patent
Suzuki et al.

(10) Patent No.: US 11,310,933 B2
(45) Date of Patent: Apr. 19, 2022

(54) STORAGE DEVICE

(71) Applicant: Hitachi, Ltd., Tokyo (JP)

(72) Inventors: Hibiki Suzuki, Tokyo (JP); Yuichi Saigan, Tokyo (JP); Tatsuhiko Fukazawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 44 days.

(21) Appl. No.: 16/808,606

(22) Filed: Mar. 4, 2020

(65) Prior Publication Data

US 2021/0144876 A1 May 13, 2021

(30) Foreign Application Priority Data

Nov. 13, 2019 (JP) .............................. JP2019-205214

(51) Int. Cl.
*H05K 7/14* (2006.01)

(52) U.S. Cl.
CPC ............ *H05K 7/1441* (2013.01); *H05K 7/14* (2013.01); *H05K 7/1439* (2013.01); *H05K 7/1454* (2013.01); *H05K 7/1485* (2013.01)

(58) Field of Classification Search
CPC ...... H05K 7/1441; H05K 7/14; H05K 7/1439; H05K 7/1454; H05K 7/1485
USPC .................................................. 361/679.31
See application file for complete search history.

(56) References Cited

U.S. PATENT DOCUMENTS

| 8,374,731 B1* | 2/2013 | Sullivan | G11B 33/142 700/299 |
| 2002/0018339 A1 | 2/2002 | Uzuka et al. | |
| 2006/0039108 A1* | 2/2006 | Chikusa | G11B 33/128 361/695 |
| 2006/0169789 A1* | 8/2006 | Barsun | H05K 7/20727 236/49.3 |
| 2014/0008370 A1* | 1/2014 | Judd | H05K 7/14 220/500 |
| 2014/0247569 A1* | 9/2014 | Foisy | G06F 1/16 361/759 |
| 2015/0351233 A1* | 12/2015 | Peterson | H05K 1/141 361/785 |
| 2018/0060477 A1* | 3/2018 | Maisel | H05K 1/0295 |
| 2019/0166714 A1* | 5/2019 | Choyikkunnil | G11B 33/128 |
| 2020/0067229 A1* | 2/2020 | Tsorng | H05K 1/144 |

FOREIGN PATENT DOCUMENTS

JP  2002-057419 A  2/2002

* cited by examiner

*Primary Examiner* — Anatoly Vortman
*Assistant Examiner* — Zhengfu J Feng
(74) *Attorney, Agent, or Firm* — Mattingly & Malur, PC

(57) ABSTRACT

A storage device includes a casing; a drive that records data; a controller that controls a data processing of the drive; and a midplane that connects the drive to the controller, in which the midplane includes a plurality of split midplanes which are replaceable, a drive side connector is disposed on a drive side of the split midplane, and the drive side connector is connected to the drive.

10 Claims, 16 Drawing Sheets

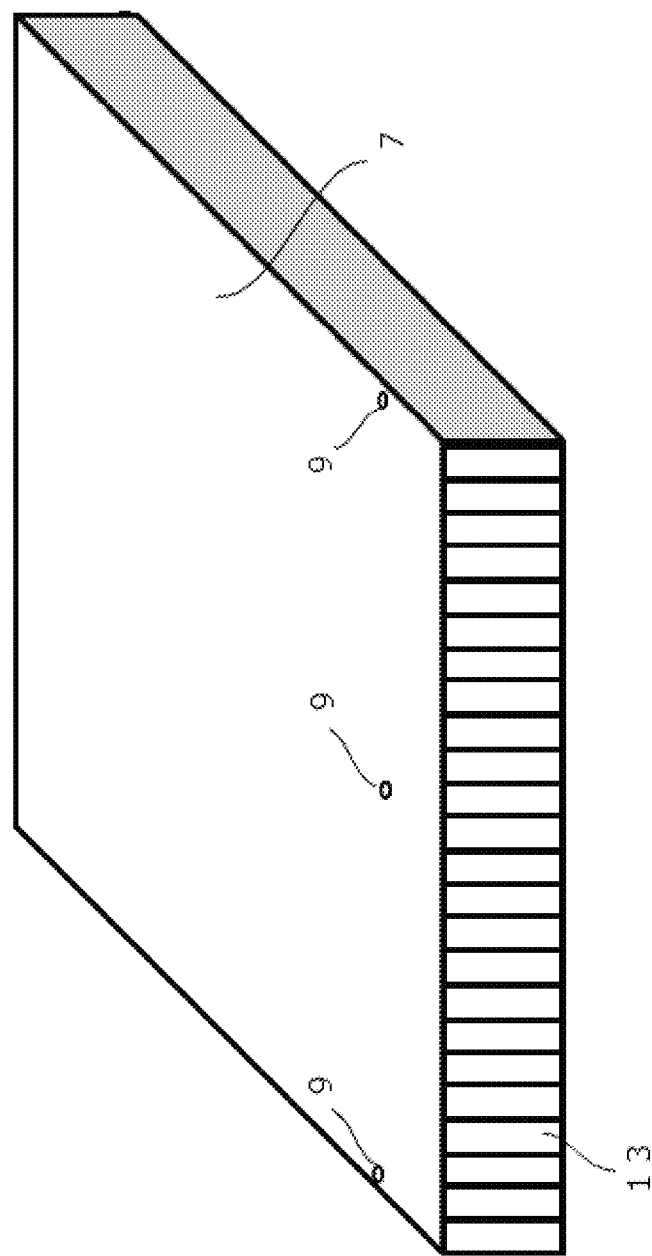

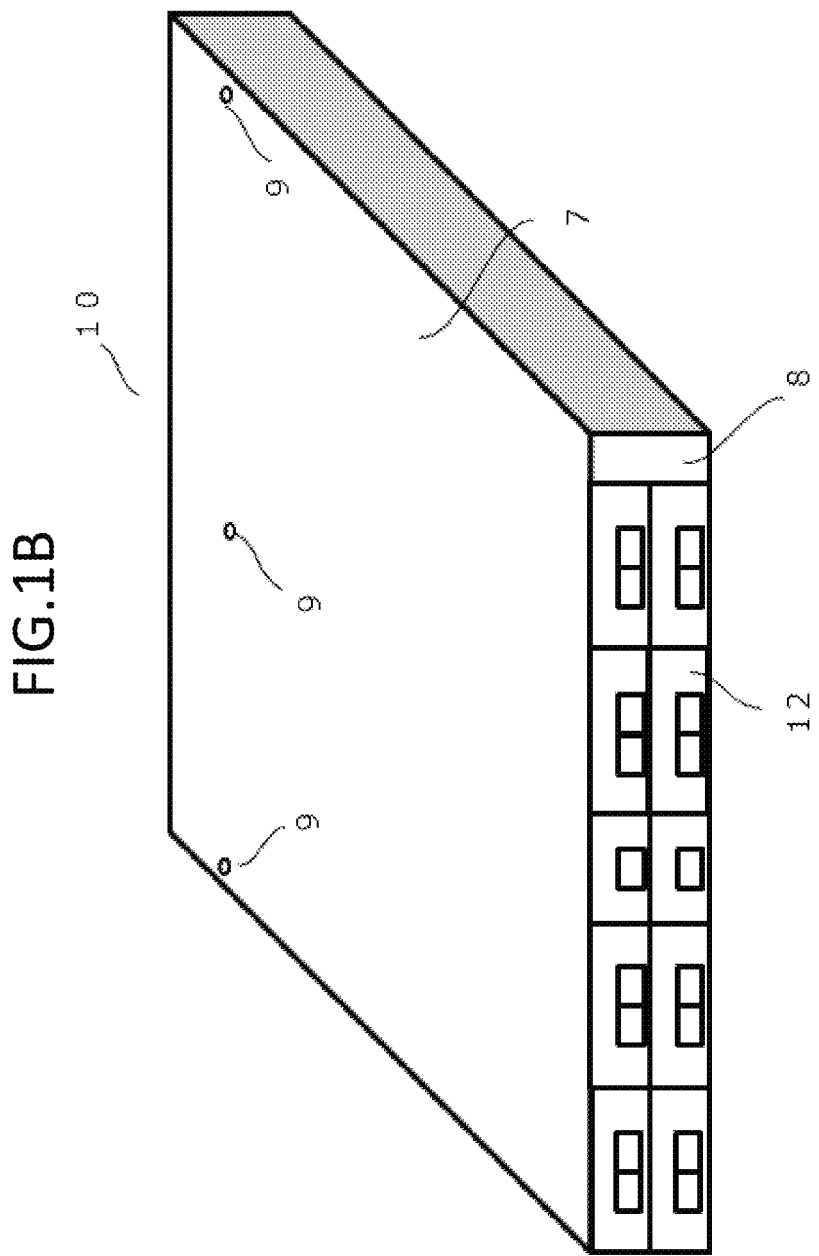

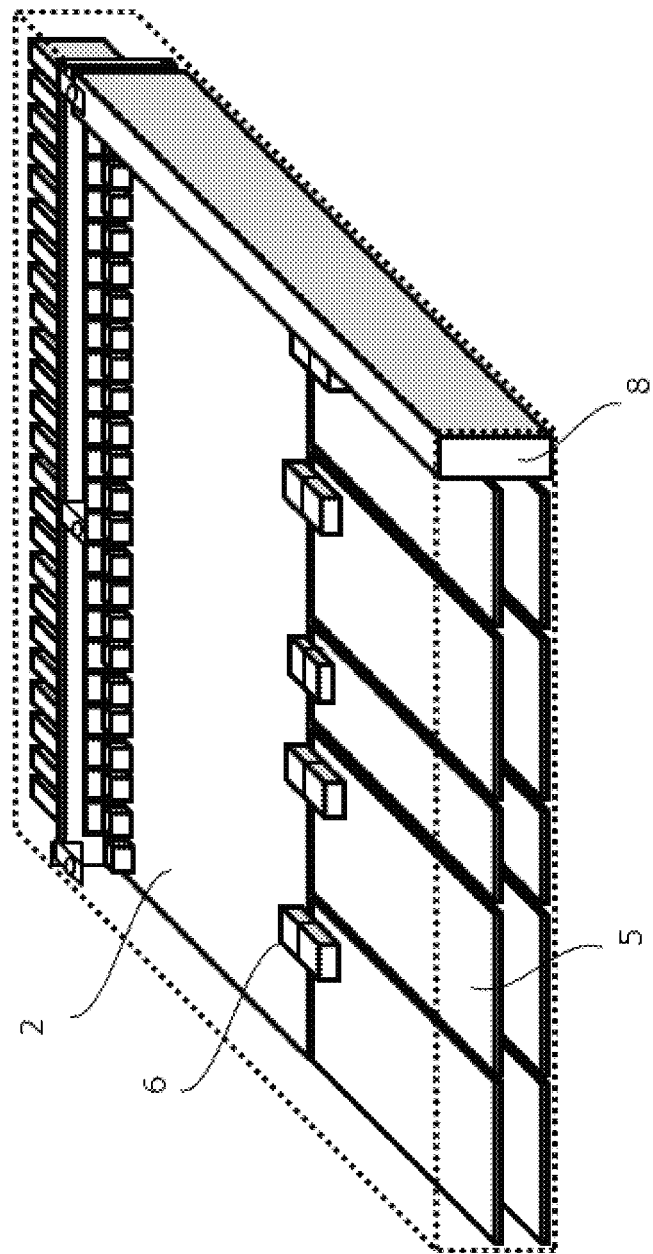

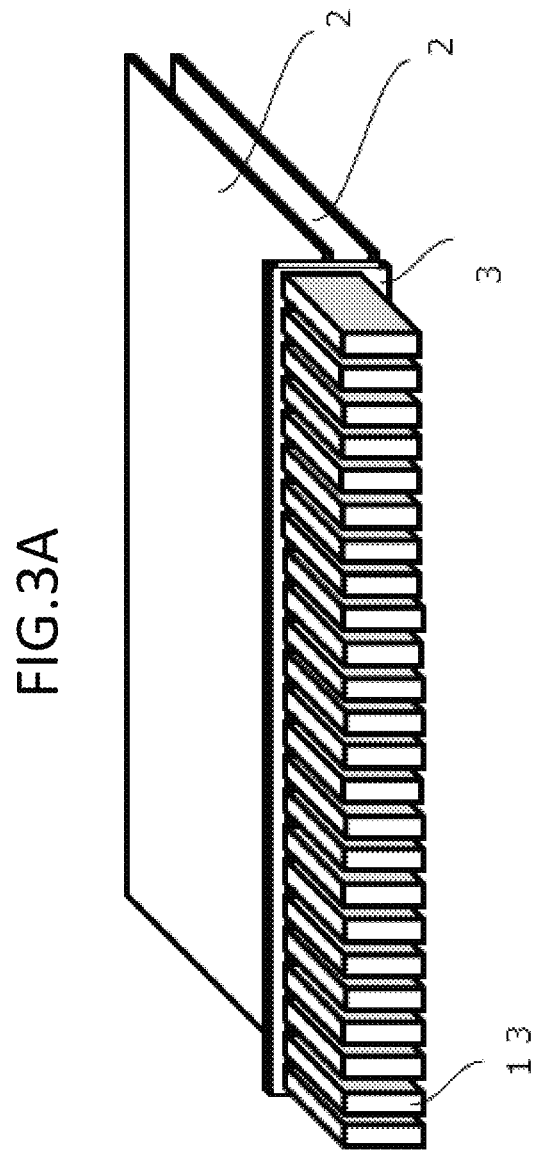

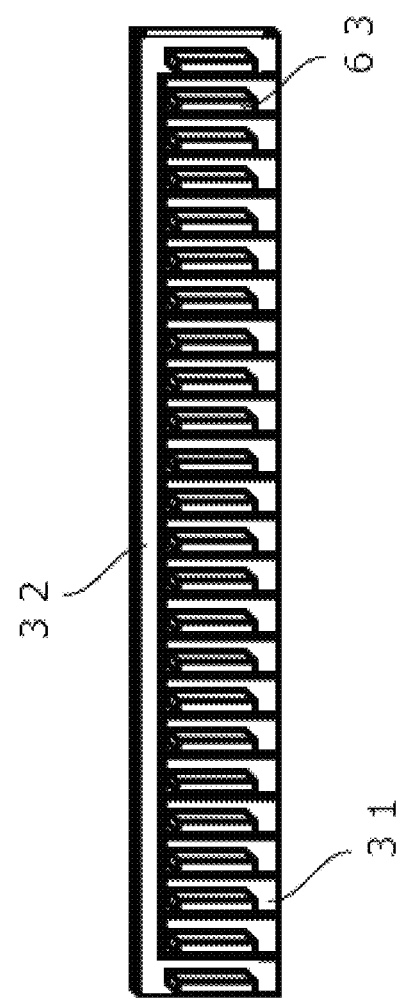

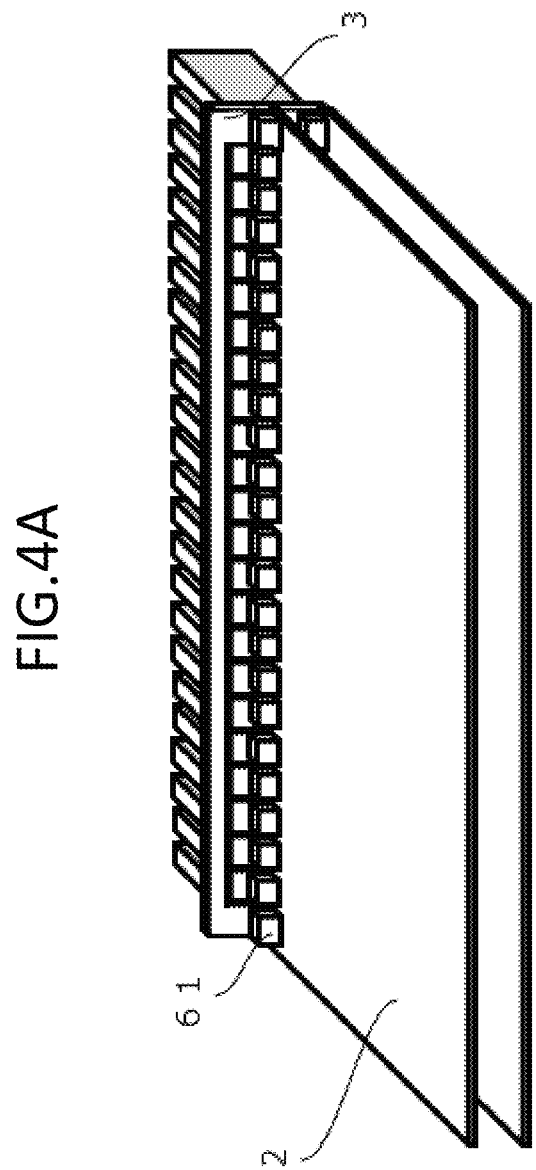

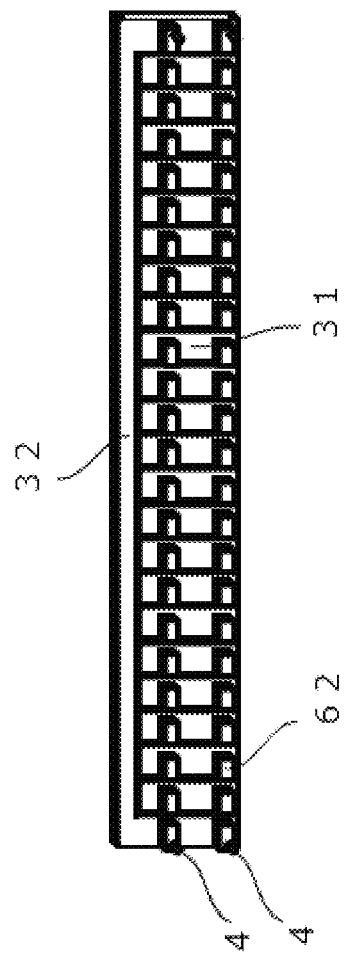

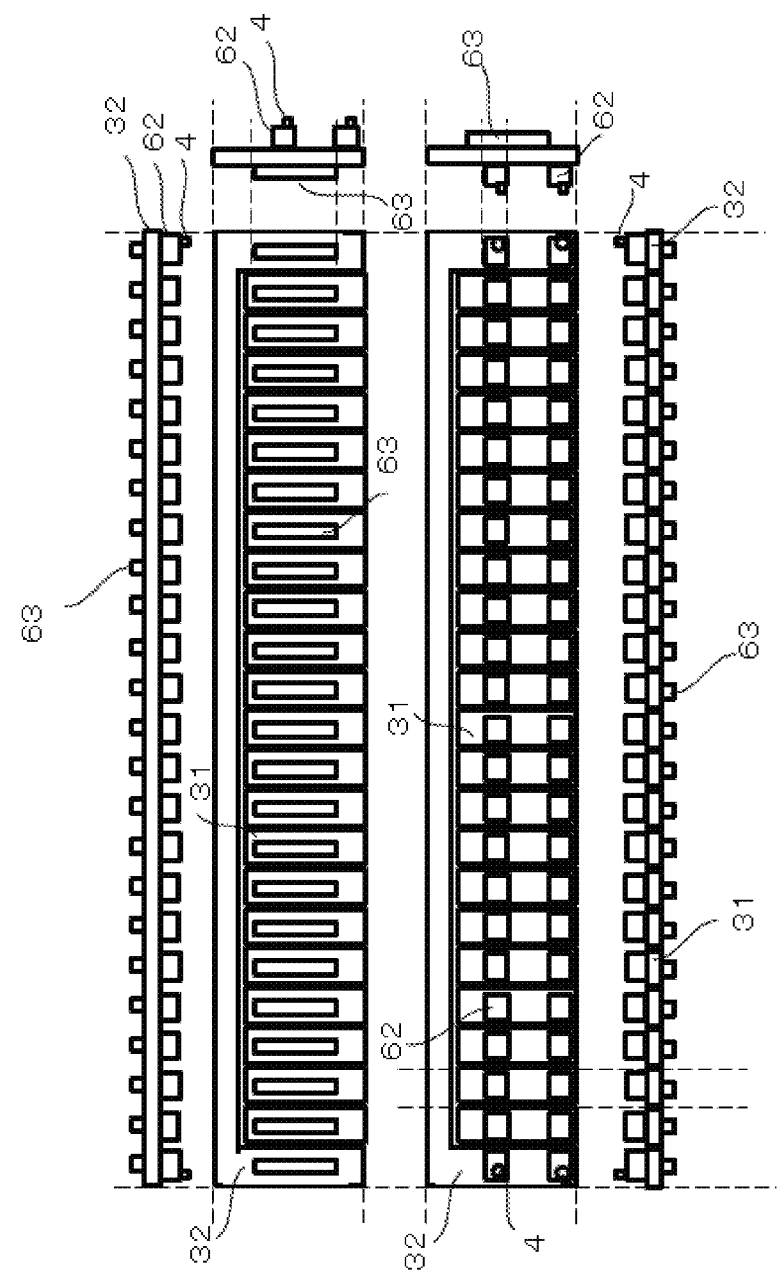

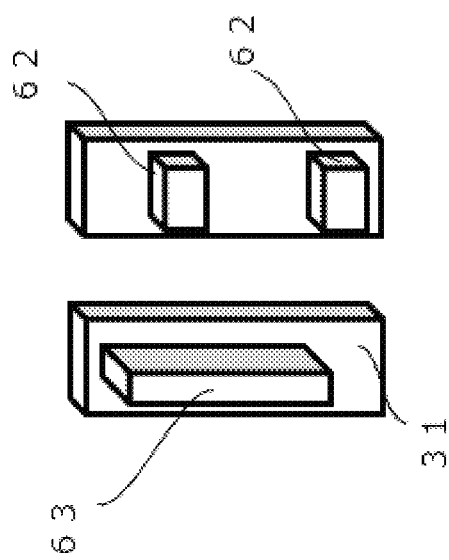

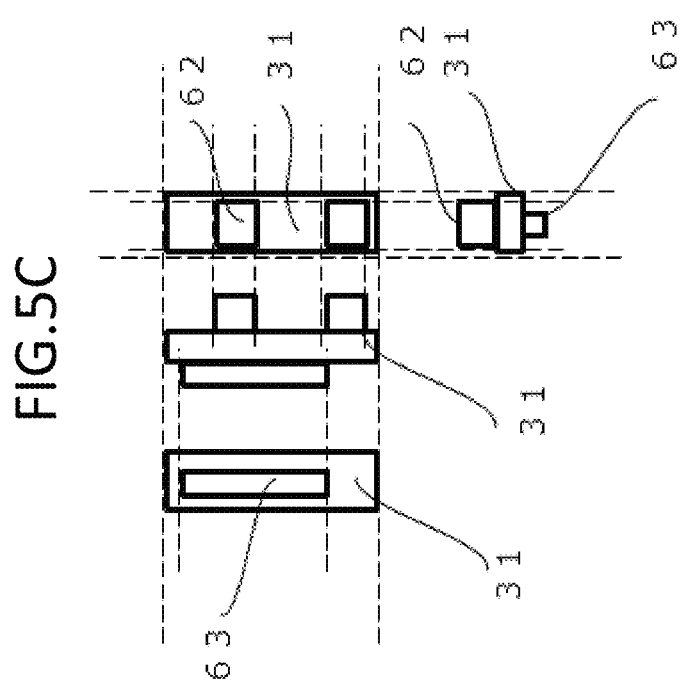

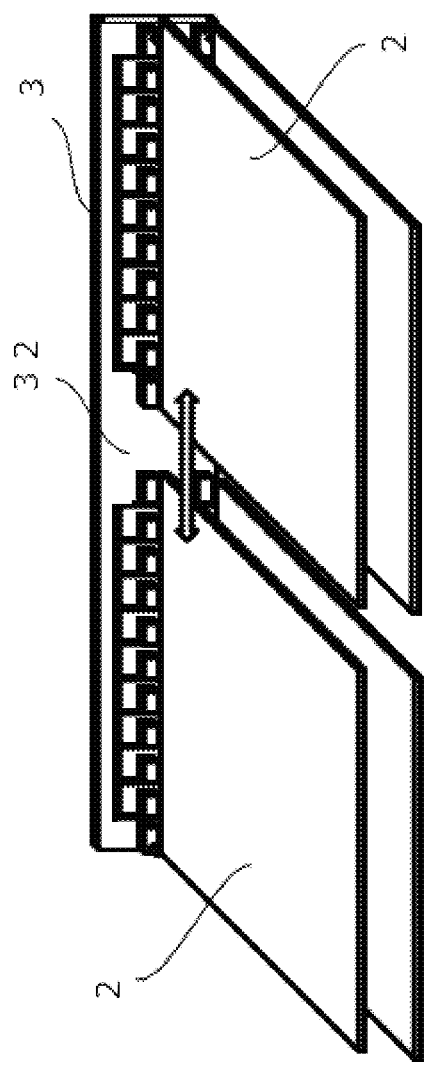

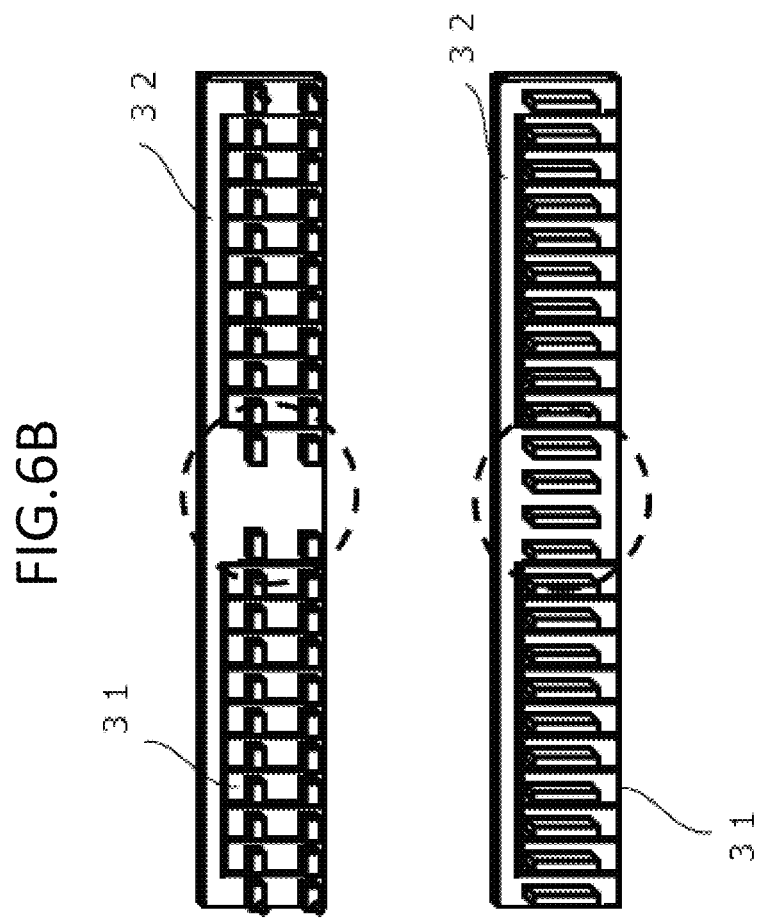

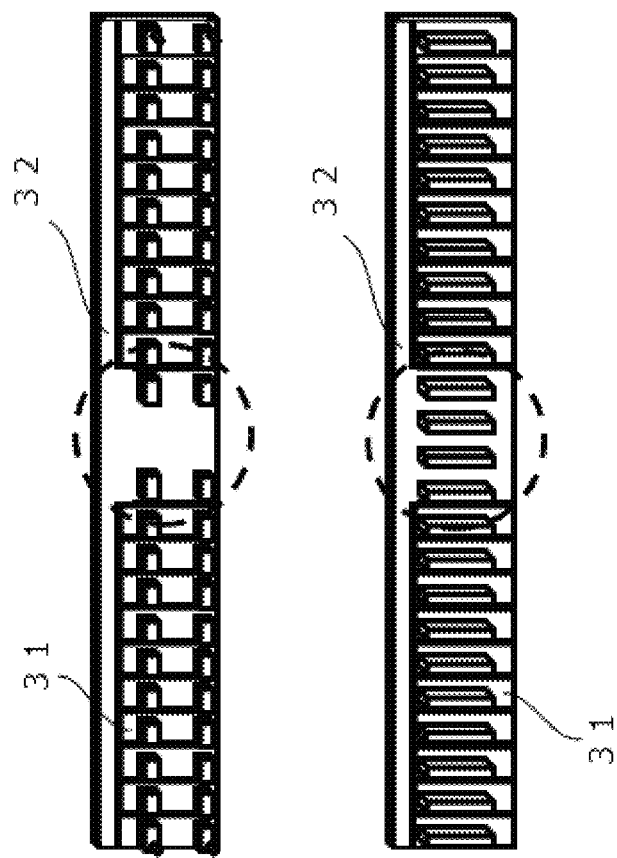

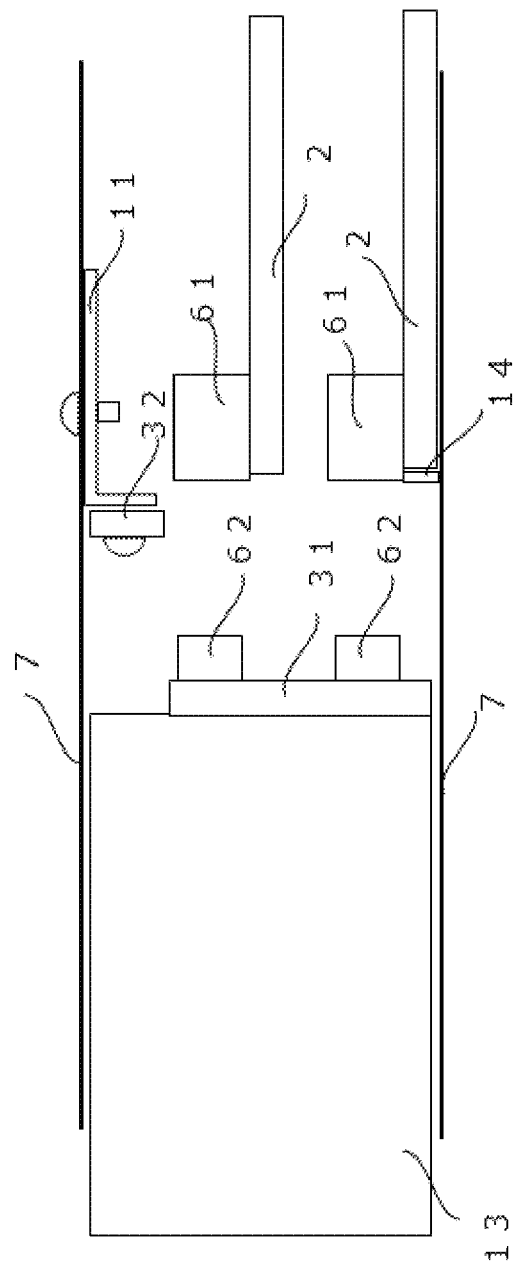

STORAGE DEVICE

CROSS-REFERENCE TO RELATED APPLICATION

The present application claims priority from Japanese application JP2019-205214, filed on Nov. 13, 2019, the contents of which is hereby incorporated by reference into this application.

BACKGROUND OF THE INVENTION

1. Field of the Invention

The present invention relates to a storage device.

2. Description of the Related Art

A tenth example of JP 2002-57419 A discloses a configuration where back panels 70J and 80J are split into strip-shaped panels for each motherboard unit in an information processing device (refer to paragraph number 0130). There is disclosed that with such a configuration, the strip-shaped panels are not warped and are well connector-connected to eight crossbar board units 60-1 to 60-8 of a motherboard unit 51J (refer to paragraph number 0132).

The storage industry expects a rapid change in the technology trend of a communication scheme such as PCIe (registered trademark of PCI-SIG) or SAS. In order to provide a product that follows a change in the technology trend, a device is required to have a structure where the communication interface (I/F) or performance can be flexibly updated.

JP 2002-57419 A does not take account of the device with a structure where updating can be flexibly performed to follow a change in the technology trend.

In order to provide a product that follows a change in the technology trend, there is required a storage device that can be updated to have a different transmission characteristic without requiring to shut off a power supply (hereinafter, referred to as power shutoff) or replace a casing.

SUMMARY OF THE INVENTION

An object of the present invention is to provide a storage device that can have a different transmission characteristic without requiring to have power shutoff or replace a casing.

As one preferred example of the present invention, there is provided a storage device including a casing; a drive that records data; a controller that controls a data processing of the drive; and a midplane that connects the drive to the controller, in which the midplane includes a plurality of split midplanes which are replaceable, a drive side connector is disposed on a drive side of the split midplane, and the drive side connector is connected to the drive.

According to the present invention, it is possible to realize a different transmission characteristic without requiring to have power shutoff or replace the casing. Problems, configurations, and effects other than those described above will become apparent from the following description of embodiments for carrying out the invention.

BRIEF DESCRIPTION OF THE DRAWINGS

FIG. 1A is an entire perspective view of a storage device as seen from a drive side in a first example;

FIG. 1B is an entire perspective view of the storage device as seen from a controller side in the first example;

FIG. 2B is a perspective view inside the casing as seen from the controller side in the first example;

FIG. 3A is a perspective view illustrating the configuration of connection between a midplane and a drive as seen from the drive side in the first example;

FIG. 3B is a configuration view of a drive side of the midplane in the first example;

FIG. 4A is a perspective view illustrating the configuration of connection between a controller and the midplane as seen from the controller side in the first example;

FIG. 4B is a configuration view of a controller side of the midplane in the first example;

FIG. 5A illustrates configuration views as seen from an upper surface, a lower surface, a front surface, a back surface, and a side surface of the midplane in the first example;

FIG. 5B is a perspective view of a split midplane in the first example;

FIG. 5C illustrates configuration views as seen from a front surface, a side surface, a back surface, and an upper surface of the split midplane in the first example;

FIG. 6A is a perspective view illustrating the configuration of connection between a controller and a midplane as seen from the controller side in a second example;

FIG. 6B is a configuration view of a first guide midplane in the second example;

FIG. 6C is a configuration view of a second guide midplane in the second example;

FIG. 8 is an internal configuration view of the storage device in the first example as seen from a side surface thereof.

DETAILED DESCRIPTION OF THE PREFERRED EMBODIMENTS

Figure 2A:
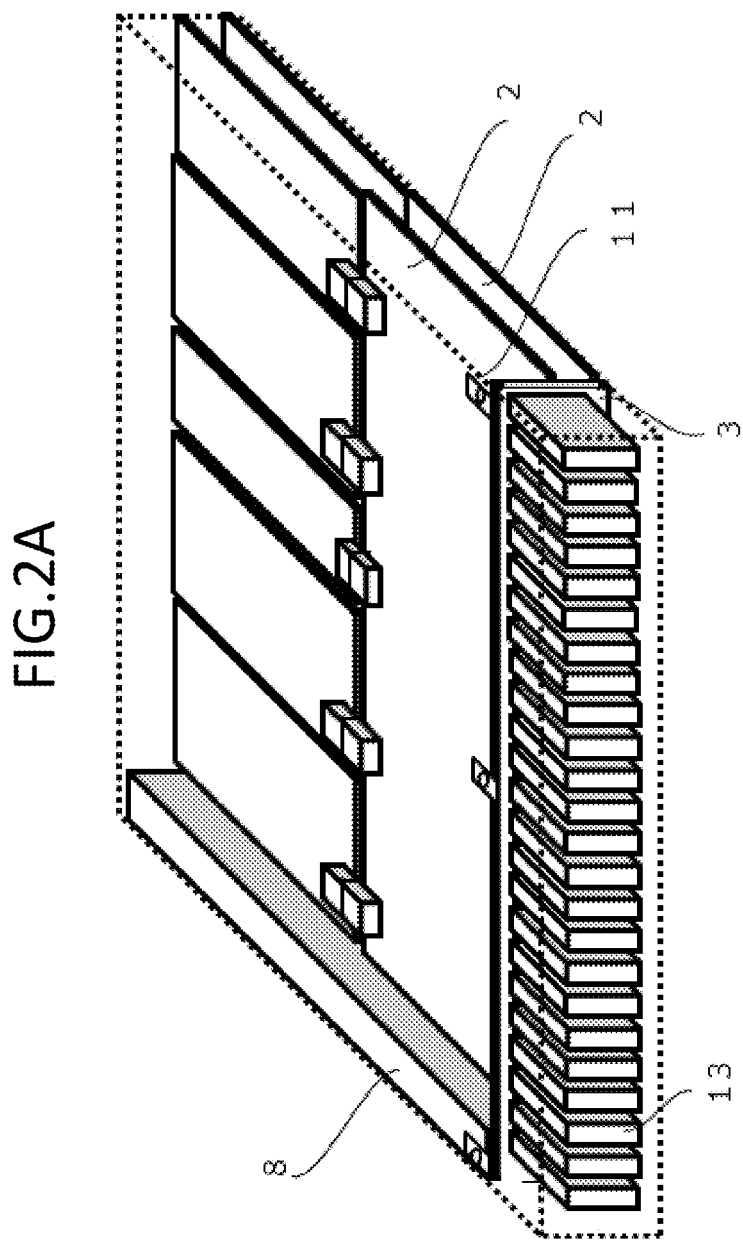
FIG. 2A is a perspective view inside a casing as seen from the drive side in the first example.

Hereinafter, examples will be described with reference to the drawings.

First Example

FIG. 1A illustrates an entire perspective view of a storage device 10 of a first example as seen from a drive side. The storage device 10 is surrounded by a casing 7. A drive, a controller, a midplane, an interface substrate, and a connector are stored in the casing 7.

The casing 7 is fixed to an L-shaped sheet metal (not illustrated) therein with screws 9 which are holding portions. The L-shaped sheet metal is fixed to a guide midplane (not illustrated).

A plurality of trays 13 are disposed on a foreground side surface of the casing in FIG. 1A. The drive is stored in the tray 13.

The drive is a recording medium that records data. Various storage devices such as a hard disk device, a semiconductor memory device, an optical disk device, and a magneto-optical disk device onto and from which data can be read and written can be used as the recording medium. For example, a fibre channel (FC) disk, a small computer system interface (SCSI) disk, a SATA disk, an AT attachment (ATA) disk, a serial attached SCSI (SAS) disk, or the like can be used as the hard disk device. In addition, various storage devices such as a flash memory (solid state drive: SSD), a magnetoresistive random-access memory (MRAM), a phase-change memory, a resistive random access memory (ReRAM), a ferroelectric random access memory (FeRAM), and a flash module drive (FMD) can be used. Furthermore, for example, a configuration where different types of storage devices are mixed may be adopted.

The controller is a control unit that controls a data processing such as recording data onto the drive. For example, the controller includes a microprocessor and a memory. The microprocessor controls the operation of the controller by reading and executing a computer program stored in the memory.

The midplane is a substrate with wirings, a drive side connector is disposed on one surface of the midplane, and a controller side connector is disposed on an opposite surface thereof. The midplane connects the drive to the controller via the connectors. Alternatively, the midplane connects a plurality of controllers.

The interface substrate is a substrate on which an IC circuit for the conversion of a communication scheme is mounted. The controller is connected to a host server or drives other than the drive in the storage device 10 via the interface substrate.

FIG. 1B illustrates an entire perspective view of the storage device 10 as seen from a controller side. A connection interface 12 is disposed on a foreground side surface of the casing in FIG. 1B. A power supply unit 8 including a power supply of the storage device 10 is disposed in a right end portion of the storage device 10 in FIG. 1B.

FIG. 2A is a configuration view of the storage device in the casing as seen from the drive side. A midplane 3 is disposed substantially perpendicular to a bottom surface of the casing (including being perpendicular thereto and including the allowable range of a shift in angle which occurs during assembly, such as when the midplane is connected to the bottom surface of the casing or the midplane is held). It is possible to make the storage device compact by providing the midplane 3 upright.

The plurality of trays 13 are disposed on a foreground side of the midplane 3, and the drive is stored in the tray 13. Two controllers 2 are disposed in a vertical direction on a side of the midplane 3, which is opposite to the drive. An L-shaped sheet metal 11 is fixed to an upper surface (not illustrated) of the casing with screws or the like. In addition, the power supply unit is disposed on a left-hand side as seen from front.

FIG. 2B is a configuration view of an interior of the storage device illustrated in FIG. 2A as seen from the controller side. Connectors 6 mounted on a surface of the controller 2 are connected to a plurality of the connectors that are mounted on a plurality of the interface substrate which are disposed on the foreground side.

FIG. 3A is a view illustrating a drive side configuration of the midplane 3. The plurality of trays 13 are disposed on a drive side of the midplane 3.

FIG. 3B is a view illustrating a configuration where the trays 13 which accommodate the drives are removed from the configuration illustrated in FIG. 3A, and a drive side connector 63 is disposed on the drive side of the midplane 3. The midplane 3 includes a guide midplane 32 formed of an upper portion and both end portions in a horizontal direction, and a plurality of split midplanes 31.

The guide midplane 32 has a function of increasing the rigidity of the casing 7 illustrated in FIGS. 1A and 1B, and a function of guiding the alignment of a substrate forming the controller 2. The guide midplane 32 is not configured to be splittable.

In addition, the guide midplane 32 includes the drive side connectors 63 at both ends thereof.

It is possible to replace the split midplane 31 by attaching or detaching the split midplane 31. In addition, each of the split midplanes 31 includes the drive side connector 63.

FIG. 4A is a view illustrating a controller 2 side configuration of the midplane 3. A plurality of connectors 61 are disposed in the controller 2 to correspond to the connectors of the midplane 3.

FIG. 4B is a view illustrating the configuration of a controller side surface of the midplane.

Controller side connectors 62 are disposed at both ends of the guide midplane 32, and guide pins 4 are disposed at tips of the controller side connectors 62.

The guide pin 4 is connected to a recess portion of the connector 61 that is disposed in the controller 2 to face the guide pin 4. The guide pin 4 has a function of guiding the alignment between the controller 2 and the midplane. The controller side connector 62 is disposed also in each of the plurality of split midplanes 31.

FIG. 5A is a view illustrating the structure of the midplane and the connector. The figure in a first row is a view of the midplane as seen from above. The drive side connectors 63 mounted on the midplane are disposed on an upper side of FIG. 5A, and the controller side connectors 62 mounted on the midplane are disposed on a lower side. Since the figure in the first row is a view of the midplane as seen from above, the guide midplane 32 can be seen as the midplane.

The figure in a second row is a front view of the midplane as seen from the drive side. The guide midplane 32 is disposed in the right and left end portions and the upper portion of the midplane. The plurality of split midplanes 31 which are surrounded by the guide midplane 32 are horizontally disposed. The drive side connectors 63 are mounted on the guide midplane 32. Furthermore, the drive side connector 63 is mounted on each of the split midplanes 31.

The figure in a third row is a front view of the midplane as seen from the controller side, in which the plurality of split midplanes 31 are horizontally disposed. The controller side connector 62 is mounted on each of the split midplanes 31. The controller side connectors 62 are disposed in the guide midplane 32 at both right and left ends, and the guide pins 4 are disposed at the tips of the controller side connectors 62.

The figure in a fourth row is a view of the midplane as seen from below. Since the figure in the fourth row is a view of the midplane as seen from below, the guide midplane 32 can be seen in both right and left end portions of the midplane, and the split midplanes 31 which are interposed between the guide midplane 32 at both ends can be seen.

The figure on a side of the second row illustrates the configuration of the midplane and the connector as seen from a right side of the second row in a state where the drive side faces the front.

The figure on a side of the third row illustrates the configuration of the midplane and the connector as seen from the right side of the second row in a state where the controller side faces the front.

FIG. 5B illustrates a perspective view of a drive side and a controller side of the split midplane 31. As illustrated in the left figure of FIG. 5B, the drive side connector 63 connected to the connector of the drive is disposed on a drive side surface of the split midplane 31.

As illustrated in the right figure of FIG. 5B, two controller side connectors 62 connected to the connectors of the controller 2 are disposed on the controller side of the split midplane 31.

In FIG. 5C, a front view of the drive side of the split midplane 31, a side view of the split midplane 31, and a front view of the controller side of the split midplane 31 are illustrated from the left, and a view of the split midplane 31 as seen from above is illustrated in a lower row.

The drive side connector 63 is disposed on the drive side of the split midplane 31. In addition, the controller side connectors 62 are disposed on the controller side of the split midplane 31.

Figure 7:
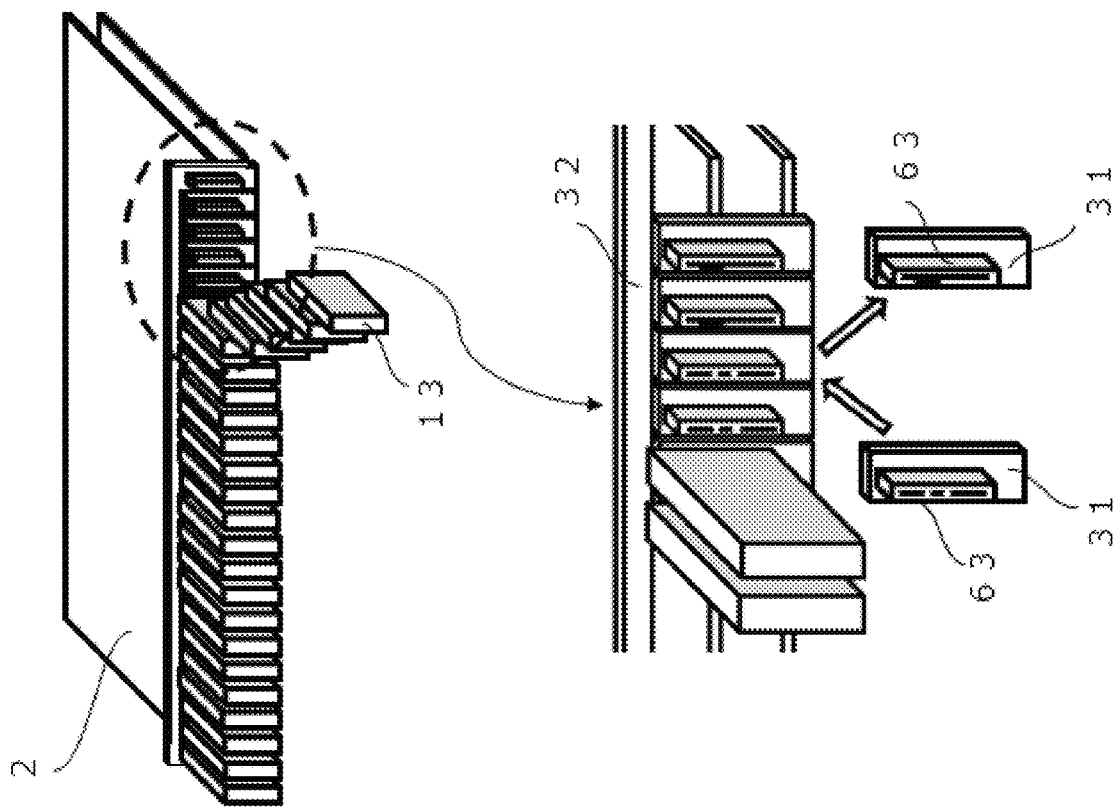
FIG. 7 is a view illustrating an example where different types of connectors are mixed on a drive side of the midplane.

FIG. 7 illustrates an example where different types of the drive side connectors 63 are used. As illustrated in FIG. 7, each of the trays 13 which store drives 1 is configured to be attachable to and detachable from the connector of the midplane. The split midplanes 31 include connectors having different connector shapes or different transmission characteristics.

The drive side connector 63 in the split midplane 31 on the left lower side of FIG. 7 is an enterprise and data center SSD form factor (EDSFF) connector that is compatible with the Gen 5 which is the fifth generation of PCIe.

The drive side connector 63 in the split midplane 31 on the right lower side of FIG. 7 is an example of an M dot two (M.2) connector that is not compatible with the Gen 5. The drive side connectors 63 are the drive side connectors 63 having different shapes and different transmission performances, and it is possible to realize the storage device with a different transmission performance by replacing the split midplanes 31.

Here, an example where each one of two types of connectors is used has been described; however, the type or number of connectors in use can be freely selected within a range defined by the number of the split midplanes 31.

In addition, the controller side connectors can be changed to have an improved transmission performance by replacing the split midplanes 31 with other split midplanes 31 where connectors having the same shape as that of the corresponding connectors 61 in the controller 2 and different transmission characteristics are disposed.

In this example, it is possible to replace a connector and the transmission characteristics of the split midplane 31 connected to the connector according to a trend following a change in technology. For this reason, it is possible to realize the storage device with a different transmission characteristic without requiring to have power shutoff or replace the casing.

FIG. 8 is a view illustrating the configuration of the interior of the storage device as seen from the right side in a state where the drive side of the storage device faces the front. Here, a mode where the trays 13 and the split midplanes 31 are inserted toward the controller 2 is illustrated.

The guide midplane 32 is screwed to the casing 7 by using the L-shaped sheet metal 11.

The split midplane 31 is fixed to the tray 13. The split midplane 31 and the tray 13 are fixed to the casing 7 with fixation portions such as the guide midplane 32, a claw 14 in the casing, and a latch structure (not illustrated) for preventing the falling out of the drive.

The controllers 2 are formed in two stages in the vertical direction, and the connector 61 connected to the connector 62 of the midplane is disposed in each of the controllers 2.

According to the first example, it is possible to realize the storage device with a different transmission characteristic without requiring to have power shutoff or replace the casing.

Second Example

FIGS. 6A, 6B, and 6C are views illustrating the configuration of a midplane in a second example. The first example has a configuration where the controllers 2 are provided in two stages in the vertical direction and one row in the horizontal direction. On the other hand, the second example has a configuration where the controllers 2 are provided in two rows, and the configuration is suitable for when small controllers are used. Other points such as the way of disposing the split midplanes 31 are the same as those in the first example.

FIG. 6A is a perspective view illustrating the configuration of connection between the midplane 3 and the controller 2 in the second example. The controllers 2 on the right and left sides are connected to each other via the guide midplane 32.

Specifically, in regard to the configuration, a circuit (not illustrated) of one controller 2 is connected to a circuit (not illustrated) of the other controller via the connector of the controller 2 and a first connector of the guide midplane 32, via wirings disposed in the guide midplane 32, and then via the connector of the other controller 2 from a second connector of the guide midplane 32.

FIG. 6B is a view illustrating an example where the shape of the guide midplane 32 is an M shape. The figure in an upper row of FIG. 6B is a front view of the guide midplane 32 and the split midplanes 31 as seen from the controller side. The figure in a lower row of FIG. 6B is a front view of the guide midplane 32 and the split midplanes 31 as seen from the drive side. A location indicated by the dotted circle has a configuration where connectors are disposed in the guide midplane 32, and the guide midplane 32 with the connectors is configured to be non-splittable.

Since the guide midplane 32 having an M shape is provided, unlike the guide midplane 32 of the first example, a non-splittable and integrated midplane is disposed in a central portion; and thereby, it is possible to further increase the rigidity than that of the midplane of the first example.

FIG. 6C is a view illustrating an example where the shape of the guide midplane 32 is a T shape. The figure in an upper row of FIG. 6C is a front view of the guide midplane 32 and the split midplanes 31 as seen from the controller side. The figure in a lower row of FIG. 6C is a front view of the guide midplane 32 and the split midplanes 31 as seen from the drive side. A location indicated by the dotted circle has a configuration where connectors are disposed in the guide midplane 32, and the guide midplane 32 with the connectors is configured to be non-splittable.

Since the guide midplane 32 having a T shape is provided, unlike the guide midplane 32 of the first example, a non-splittable and integrated midplane is disposed in a central portion; and thereby, it is possible to further increase the rigidity than that of the midplane of the first example.

Even when small controllers are used, similar to the first example, the second example has the effect of being able to realize the storage device with a different transmission characteristic without requiring to have power shutoff or replace the casing. In addition, in this example, the shape of the guide midplane is changed; and thereby, it is possible to further increase the rigidity.

What is claimed is:

1. A storage device comprising:
   a casing;
   a plurality of drives that record data;
   at least one controller that controls data processing of the plurality of drives; and
   a midplane that connects the plurality of drives to the at least one controller,
   wherein the midplane is disposed substantially perpendicular to a bottom surface of the casing, includes a guide midplane formed of an upper portion and two end portions in a horizontal direction parallel to the bottom surface of the casing, and includes a plurality of split midplanes which are replaceable and are positioned between the two end portions of the guide midplane,
   wherein a plurality of drive side connectors are disposed on a drive side of the split midplanes and the two end portions of the guide midplane, wherein the drive side connectors of the split midplanes are between the drive side connectors of the guide midplane, and each of the drive side connectors is connected to one of the drives, respectively, and
   wherein a plurality of controller side connectors are disposed on a controller side of the split midplanes and connected to the at least one controller, and each of the controller side connectors is connected to the at least one controller.

2. The storage device according to claim 1,
   wherein the at least one controller comprises a plurality of controllers,
   wherein the midplane is connected to the plurality of controllers via the controller side connectors.

3. The storage device according to claim 1,
   wherein the at least one controller comprises a plurality of controllers,
   wherein a plurality of rows of the controllers are disposed, and
   wherein the midplane connects the plurality of rows of the controllers to each other via a connector of the guide midplane.

4. The storage device according to claim 1,
   wherein the midplane includes the guide midplane with an M shape separately from the split midplanes.

5. The storage device according to claim 1,
   wherein the midplane includes the guide midplane with a T shape separately from the split midplanes.

6. The storage device according to claim 1,
   wherein each of the controller side connectors includes a guide pin for an alignment with a corresponding connectors disposed in the at least one controller, respectively.

7. The storage device according to claim 1,
   wherein each of the controller side connectors is connected to corresponding connectors disposed in the at least one controller, respectively, and
   wherein the storage device includes a fixation portion that fixes a tray, which stores a drive of the plurality of drives, to each of the split midplanes, respectively.

8. The storage device according to claim 1,
   wherein at least one of the drive side connectors has a size that is different from the size of another one of the drive side connectors.

9. The storage device according to claim 1,
   wherein at least one of the drive side connectors has a transmission performance that is different from the transmission performance of another one of the drive side connectors.

10. The storage device according to claim 8,
    wherein the at least one of the drive side connectors has a transmission performance that is different from the transmission performance of the another one of the drive side connectors.

* * * * *